United States Patent [19]

Lenz

[11] 4,151,465
[45] Apr. 24, 1979

[54] VARIABLE FLEXURE TEST PROBE FOR MICROELECTRONIC CIRCUITS

[76] Inventor: Seymour S. Lenz, P.O. Box 669, Longwood, Fla. 32750

[21] Appl. No.: 797,073

[22] Filed: May 16, 1977

[51] Int. Cl.² .................... G01R 1/06; G01R 31/02
[52] U.S. Cl. .................... 324/158 P; 267/181; 324/72.5
[58] Field of Search .......... 324/158 P, 158 F, 73 PC, 324/72.5; 267/181, 48; 274/37

[56] References Cited

U.S. PATENT DOCUMENTS

| 2,678,685 | 5/1954 | Volsk | 267/181 |
| 3,891,924 | 6/1975 | Ardezzone et al. | 324/158 F |
| 4,045,737 | 8/1977 | Coberly | 324/158 F |

*Primary Examiner*—Rudolph V. Rolinec
*Assistant Examiner*—Ernest F. Karlsen
*Attorney, Agent, or Firm*—Duckworth, Hobby, Allen & Pettis

[57] ABSTRACT

A test probe for electronic circuit testing includes a probe arm joined to a printed circuit board adjacent to an electronic circuit to be tested, said probe arm having a flexible neck portion at one end. An electrically conductive tip is attached to the neck portion and has one end adapted to contact a portion of an electronic circuit. The neck portion of the probe arm is provided with a plurality of transverse slots and intermediate slots communicating between the transverse slots, the probe being provided with a flexible insert for extension across a preselected one of transverse slots in order to vary the probe tip pressure of the neck portion in directions substantially normal to the circuit under test.

14 Claims, 4 Drawing Figures

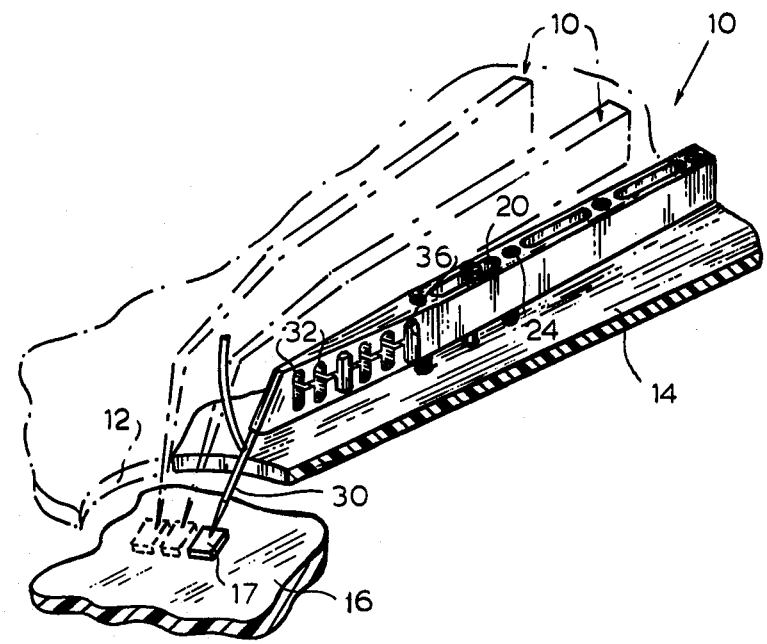
Fig. 1.
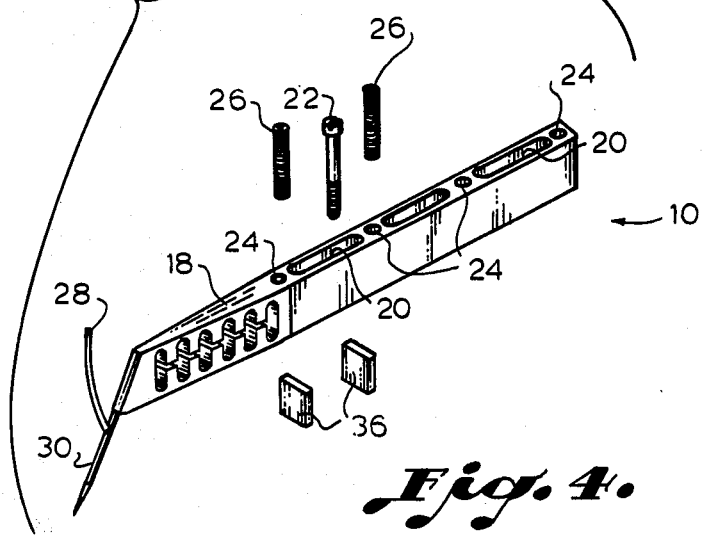
Fig. 2.
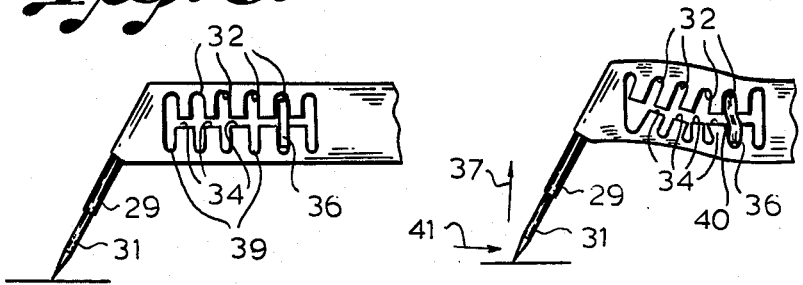
Fig. 3.
Fig. 4.

VARIABLE FLEXURE TEST PROBE FOR MICROELECTRONIC CIRCUITS

BACKGROUND OF THE INVENTION

1. Field of the Invention

The present invention relates generally to an electronic testing apparatus, and more particularly to a flexible microelectronic probe useful for testing integrated and hybrid/electronic circuits.

2. Description of the Prior Art

Recent developments in hybrid and integrated electronic circuits have resulted in progressive miniaturization of these devices. In the manufacture of these circuits, it is necessary to conduct tests to determine the circuit's electrical characteristics, in order to discover defective devices prior to or after packaging. Further, it is a common practice of the purchaser of such devices to conduct tests prior to use in the equipment in which the devices are installed. This multiple testing demands testing equipment capable of performing these tests at high rates of speed with precision.

With regard to such test equipment, there has been developed test probe cards which generally consist of an insulating printed circuit board having an opening to provide access to an integrated circuit or electronic circuit positioned adjacent to, or underneath the board. The opening is surrounded by a ring of test probes, each of which is bound to the circuit board and each of which has a probe for making contact to a predetermined contact pad on the circuit under test.

Because the conductive pads on each circuit under test are relatively small, it is necessary to use pinpoint-type needle contacts to make electrical contact for testing purposes. Frequently, the distance between each corresponding probe arm and the extremity of the conductive tip differs; as a result, some of the tips will "dig" into the corresponding conductive pad on the electronic circuit, while other tips may not make sufficient electrical contact at all. It is therefore desirable to provide some means for adjusting for slight changes in the distance between the end of the conductive tip and the metallic pad to be contacted by the tip on the circuit under test, and to further provide some flexure in the tip so as to prevent destruction of the metallic contact pad.

Prior art patents of interest with respect to the integrated circuit testing field include the following: U.S. Pat. Nos. 3,930,809 to Evans; 3,891,924 to Ardezzone et al; 3,560,907 to Heller; and 3,445,770 to Harmon.

SUMMARY OF THE INVENTION

The present invention contemplates a test probe for electronic circuit testing and the like comprising, in combination a probe arm adapted for joinder to a support member, such as a printed circuit board, adjacent to an electronic circuit or the like to be tested, the probe arm having a flexible neck portion at one end thereof. Means are provided for fastening the probe arm to the support, with an electrically conductive tip attached to the neck portion and having one end adapted to contact a portion of the electronic circuit under test. Means are also provided for varying the flexure, and thus, the tip pressure, of the neck whereby the movement of the neck portion relative to the support can be controlled.

In accordance with the preferred embodiment of the present invention, the flexure varying means comprise a plurality of slots extending transverse through the neck and substantially normal to the plane of the support, and intermediate slots extending transverse through the neck and substantially parallel to the first set of slots and communicating therebetween, in order to provide means for flexing the neck in directions normal to the support. A flexible insert is provided extending into a preselected one of the first slots in order to control the amount of flexure to which the neck portion of the probe arm can be subjected.

DESCRIPTION OF THE DRAWINGS

FIG. 1 is a perspective view of apparatus in accordance with the present invention, with a portion of the structure cut away.

FIG. 2 is an exploded perspective view of the apparatus of FIG. 1.

FIGS. 3 and 4 are side views, partially cut away, of the apparatus of FIGS. 1 and 2, with the apparatus shown in unflexed and flexed states, respectively.

DETAILED DESCRIPTION

A preferred embodiment of the test probe in accordance with the present invention will now be described with reference to FIGS. 1 and 2.

The test probe includes a probe arm, referred to generally as 10, which is adapted for mounting on a support member 14, such as a phenol printed circuit board, for example. The suppport 14 includes a hole 12 therein below which an electronic circuit 16 to be tested is shown. The electronic circuit 16 includes a plurality of terminal pads 17 to be contacted by the respective tips 30 of the probe arms 10, as described in greater detail below.

The probe arm 10 includes a narrow, flexible neck portion 18 at the end of the probe arm adjacent the hole 12. Preferably, the neck portion 18 is tapered from the widest dimension of the probe arm 10. The probe arm 10 is integrally formed of a flexible plastic material.

The oblong probe arm 10 further includes a plurality of longitudinal mounting slots 20 along the oblong arm, with the exception of the narrow neck portion 18. A mounting screw 22 extends through one mounting slot 20 and is screwed into the support 14 to join the probe arm 10 thereto. The probe arm 10 is further provided with a plurality of threaded holes 24 extending through the probe arm 10 and substantially normal to the support 14. Corresponding screws 26 extend through the threaded holes 24 and serve to bias the probe arm 10 away from the support 14 in order to make gross adjustments of the distance between the extremity of the tip 30 and the metallic contact pad 17 on the electronic circuit 16.

The probe arm 10 is further provided with a conductive tip 30 which extends into the extremity of the flexible neck portion 18. The tip 30 is formed of a sleeve 29 and a contact needle 31. A conductive lead 28 is electrically connected to the tip 30 to provide means for conducting electricity to or from the tip 30 and thus, to or from the circuit 16 under test.

In accordance with the present invention, the probe arm 10 is further provided with a plurality of transverse slots 32 in the neck portion 18 and interconnecting intermediate slots 34, in order to control the flexure of the neck portion 18 (and thus, the pressure of the tip 30 on the circuit 16) in directions substantially normal to the support 14. Referring specifically to FIG. 2, the transverse slots 32 are substantially parallel with each other and extend in a plane substantially normal to the plane of the support 14, and further transverse to the long dimension of the oblong arm 10. With continuing reference to FIG. 2, the lower portion of each slot 32 has a smaller cross-sectional dimension than the corresponding dimension of the upper portion of the slot, in order to snugly engage the flexible inserts 36, described further below. Each intermediate interconnecting slot 34 extends transverse to the long direction of the oblong probe arm 10, and in a plane which is substantially parallel to the plane of the mounting support 14. It will be noted that each immediate slot 34 communicates between adjacent ones of the transverse slots 32. As best described, the transverse and intermediate slots 32, 34 form a series of interconnected "H" configurations which are substantially normal to the long direction of the probe arm 10.

The probe arm 10 is further provided with flexible inserts 36, which may be inserted within preselected ones of the transverse slots 32, to control the tip pressure of the neck portion 18, in a manner which will now be described with reference to FIGS. 3 and 4.

Noting FIG. 3, the flexible insert 36 is inserted within one of the transverse slots 32 between the extremities of the slots. Reference is now made to FIG. 4. Assuming that a force is exerted on the end of the tip 30 causing the neck portion 18 to be driven upward with respect to the plane of the support 14, the neck portion flexes only between the extremity thereof and the flexible insert 36. The lower slots 39 have a cross-sectional dimension less than that of the flexible inserts 36, allowing for a snug fit which securely holds the insert. The upper slots 32 have a cross-sectional dimension slightly wider than that of the flexible inserts 36, allowing for a sliding action of the insert. The inserts 36 are made of a flexible material to allow for a slight bending (as shown at 40), when the tip 31 is pressed against the contact pad 17 to be probed. This bending 40 allows the probe tip 18 to flex, but within a slightly reduced range. Again referring to FIG. 4, it will be seen that one of the advantages of the arrangement of the present invention is the resulting translational motion, shown by an arrow 37, of the conductive tip 30 during the first portion of the "throw" of the neck portion 18 when being flexed. This results from the shape of the transverse and intermediate slots 32, 34, allowing the motion of the tip 30 to be relatively translational rather than rotational. This motion of the tip 31 minimizes scratching of the conductor pads 17 being probed.

We claim:

1. A test probe for electronic circuits and the like, comprising in combination:
    a probe arm adapted for joinder to a support member adjacent to an electronic circuit to be tested, said probe arm having a flexible neck portion at one end thereof;
    means for fastening said probe arm to said support member;
    an electrically conductive tip attached to said neck portion and having and end adapted to contact a portion of said electronic circuit; and
    means for varying the flexure of said neck, whereby the pressure of said tip relative to said circuit can be controlled, said neck having a void therein and insertion means for positioning in said void, whereby said neck has a first flexure characteristic without said insertion means in said void and a second flexure characteristic while said insertion is in said void.

2. A test probe for electronic circuits and the like as recited in claim 1, further comprising means for biasing said probe arm away from said support member.

3. A test probe for electronic circuits and the like as recited in claim 2, wherein said biasing means further comprises means for biasing separate portions of said probe arm away from said support member.

4. A test probe for electronic circuits and the like as recited in claim 3, wherein said biasing means comprises a plurality of spaced screws threaded through said arm.

5. A test probe for electronic circuits and the like as recited in claim 1, wherein said fastening means comprises:
    said arm having at least one longitudinal slot therein extending substantially normal to said support member;
    a mounting screw extending through said slot and engaging said support member.

6. A test probe for electronic circuits and the like as recited in claim 5, further comprising means for biasing said probe arm away from said support member, said biasing means including at least one biasing screw spaced from said mounting screw for biasing a portion of said probe arm.

7. A test probe for electronic circuits and the like as recited in claim 1, wherein:
    said void is in the form of a plurality of transverse slots extending through said neck portion and generally normal to the plane of said support member and
    an intermediate slot communicating between adjacent ones of said transverse slots; whereby
    movement of said conductive tip in directions generally normal to said support member causes deformation of the relative position of said slots with respect to a relaxed, non-flexed position.

8. A test probe for electronic circuits and the like as recited in claim 7 wherein said positioning means comprises at least one flexible insert for extending into preselected ones of said transverse slots to prevent flexure of a part of said neck portion between said insert and the other end of said arm.

9. A test probe for electronic circuits and the like as recited in claim 8, wherein each of the said transverse slots is formed of two parts, with an adjacent intermediate slot between said two parts, one part having a cross-sectional dimension corresponding said insert, whereby said insert fits snugly in said one part.

10. A test probe for electronic circuits and the like as recited in claim 9, wherein said other part of each transverse slot has a cross-sectional dimension larger than the cross-sectional dimension of said one part.

11. A test probe for electronic circuits and the like, comprising, in combination:
    a probe arm adapted for joinder to a support member adjacent to an electronic circuit to be tested, said probe arm having a flexible neck portion at one end thereof;
    means for fastening said probe arm to said support member;
    an electrically conductive tip attached to said neck portion and having an end adapted to contact a portion of said electronic circuit;
    means for biasing said probe arm away from said support member; and
    means for varying the flexure of said neck, said flexure varying means including said neck a plurality of transverse slots therein extending through the neck portion and generally normal to the plane of support member, with said arm further including an intermediate slot communicating between adjacent ones of said transverse slots, and a flexible insert for extending into preselected ones of said transverse slots.

12. A test probe for electronic circuits and the like as recited in claim 11, wherein said conductive tip comprises:
 a conductive sleeve extending into the extremity of said neck at an obtuse angle with respect to the plane of support member;
 a pointed contact needle extending through said sleeve and contacting said electronic circuit.

13. A test probe for electronic circuits and the like comprising, in combination:
 an oblong probe arm adapted for joinder to a support member adjacent to an electronic circuit to be tested, said probe arm having a flexible neck portion at one end thereof;
 means for fastening said probe arm to said support member;
 an electrically conductive tip attached to said neck portion and having an end adapted to contact a portion of said electronic circuit;
 means for flexing said neck only in directions substantially normal to said support member, said flexing means including said neck having a plurality of slots extending through said neck substantially parallel with each other and substantially transverse to the long axis of said oblong arm, and said neck further including an intermediate slot communicating between adjacent ones of said plurality of slots; and
 means for varying the flexure of said neck, whereby the pressure of said tip on said circuit can be controlled, said flexure varying means further comprising a flexible insert for extension into preselected ones of said plurality of slots.

14. A test probe for electronic circuits and the like as recited in claim 13, further comprising means for biasing said probe arm away from said support member.

* * * * *